(12) United States Patent
Koike

(10) Patent No.: US 6,487,711 B1
(45) Date of Patent: Nov. 26, 2002

(54) METHOD OF ANALYZING FACTOR RESPONSIBLE FOR ERRORS IN WAFER PATTERN, AND APPARATUS FOR PRODUCING PHOTOLITHOGRAPHIC MASK

(75) Inventor: Tsutomu Koike, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/576,437

(22) Filed: May 22, 2000

(30) Foreign Application Priority Data

Dec. 7, 1999 (JP) .................................... 11-347336

(51) Int. Cl.[7] ................................................ G03F 9/00
(52) U.S. Cl. ...................... 716/19; 430/5; 118/720
(58) Field of Search ...................... 438/14, 161, 635, 438/5; 257/347, 59; 204/298.11; 118/540, 504, 720; 716/19

(56) References Cited

U.S. PATENT DOCUMENTS 5,728,592 A * 3/1998 Yania ........................ 438/161
6,045,671 A * 5/2000 Wu ........................ 204/298.11
6,054,671 A * 5/2000 Wu ........................ 204/298.11
6,261,964 B1 * 7/2001 Wu ............................ 438/705

FOREIGN PATENT DOCUMENTS

| JP | 6-232034 | 8/1994 |
| JP | 8-241860 | 9/1996 |
| JP | 11-067655 | 3/1999 |

* cited by examiner

Primary Examiner—John F. Niebling
Assistant Examiner—André C. Stevenson
(74) Attorney, Agent, or Firm—McDermott, Will & Emery

(57) ABSTRACT

A method of analyzing factor responsible errors in a wafer pattern which enables detection of an error ascribable to a difference between mask patterns and an error ascribable to another reason while distinguishing between the errors. A mask pattern is formed by etching a first mask at a first position within an etching chamber. Another mask pattern is formed by etching a second mask at a second position within the etching chamber. A wafer pattern is formed by single shot of exposing radiation through use of the first mask, and another wafer pattern is formed by single shot of exposing radiation through use of the second mask. The size of the wafer pattern formed through use of the first mask and the size of the wafer pattern formed through use of the second mask are compared with each other, thereby detecting a dimensional difference ascribable to a difference between mask patterns and a dimensional difference ascribable to another reason while distinguishing between the dimensional differences.

16 Claims, 4 Drawing Sheets

METHOD OF ANALYZING FACTOR RESPONSIBLE FOR ERRORS IN WAFER PATTERN, AND APPARATUS FOR PRODUCING PHOTOLITHOGRAPHIC MASK

BACKGROUND OF THE INVENTION

1. Field of the Invention

The present invention relates to a method of analyzing a factor responsible for an error in a wafer pattern and an apparatus for producing a photolithographic mask. More particularly, the present invention relates to a method of analyzing a factor (hereinafter referred to simply as a "factor analysis method") for detecting an error in a wafer pattern ascribable to a tolerance of mask patterns and an error in a wafer pattern ascribable to another reason while distinguishing between them, as well as an apparatus suitable for producing a mask for use with the factor analysis method.

2. Description of the Background Art

In a process of manufacturing a semiconductor device, a wafer pattern is transferred onto a semiconductor wafer through use of a photolithographic mask (hereinafter referred to simply as a "mask"). A wafer pattern transferred onto a semiconductor wafer includes an error ascribable to a tolerance of mask patterns (hereinafter referred to as a "mask pattern error") and an error ascribable to a factor other than a mask pattern error, for example, an error in a stepper, a variation in the thickness of a photoresist film, and a variation in resolution.

It is useful to determine a cause for inducing an error in a wafer pattern for promoting the development of a semiconductor device. However, it has been difficult to ascertain a ratio between a mask pattern error and an error ascribable to another reason.

SUMMARY OF THE INVENTION

The present invention has been conceived to solve such a problem and is aimed at providing a factor analysis method for detecting an error in a wafer pattern ascribable to a mask pattern error and an error in a wafer pattern ascribable to another reason while distinguishing between them.

The above objects of the present invention are achieved by a method of analyzing factor responsible for errors in a wafer pattern formed on a semiconductor wafer. In the factor analyzing method, a first mask is placed in a first position within an etching chamber. A mask pattern is formed by etching the first mask. A second mask is placed in a second position within the etching chamber such that an overlap region exists between a portion of the first mask and a portion of the second mask, provided that the first mask is set in the first position. A mask pattern is formed by etching the second mask. A wafer pattern corresponding to a single shot region is formed on the semiconductor wafer by exposing the semiconductor wafer through use of the first mask. A wafer pattern corresponding to a single shot region is formed on the semiconductor wafer by exposing the semiconductor wafer through use of the second mask. Finally, there are detected a dimensional difference ascribable to a difference between mask patterns and a dimensional difference ascribable to another reason while distinguishing the dimensional differences from each other, by comparison between the size of the wafer pattern which is included in an area (first overlap region) within the single shot region formed through use of the first mask and which corresponds to the overlap region and the size of the wafer pattern which is included in an area (second overlap region) within the single shot region formed through the second mask and which corresponds to the overlap region.

The above objects of the present invention are also achieved by an apparatus for producing a mask pattern by etching a photolithographic mask. The apparatus includes an etching chamber for etching a mask pattern. The apparatus also includes a mask table which retains a mask within the etching chamber and can hold the mask at a first position and a second position such that an overlap region exists between a portion of the mask set in the first position and a portion of the mask set in the second position, provided that the masks are set in the first position and the second position simultaneously.

Other objects and further features of the present invention will be apparent from the following detailed description when read in conjunction with the accompanying drawings.

DESCRIPTION OF THE PREFERRED EMBODIMENTS

Figure 1:
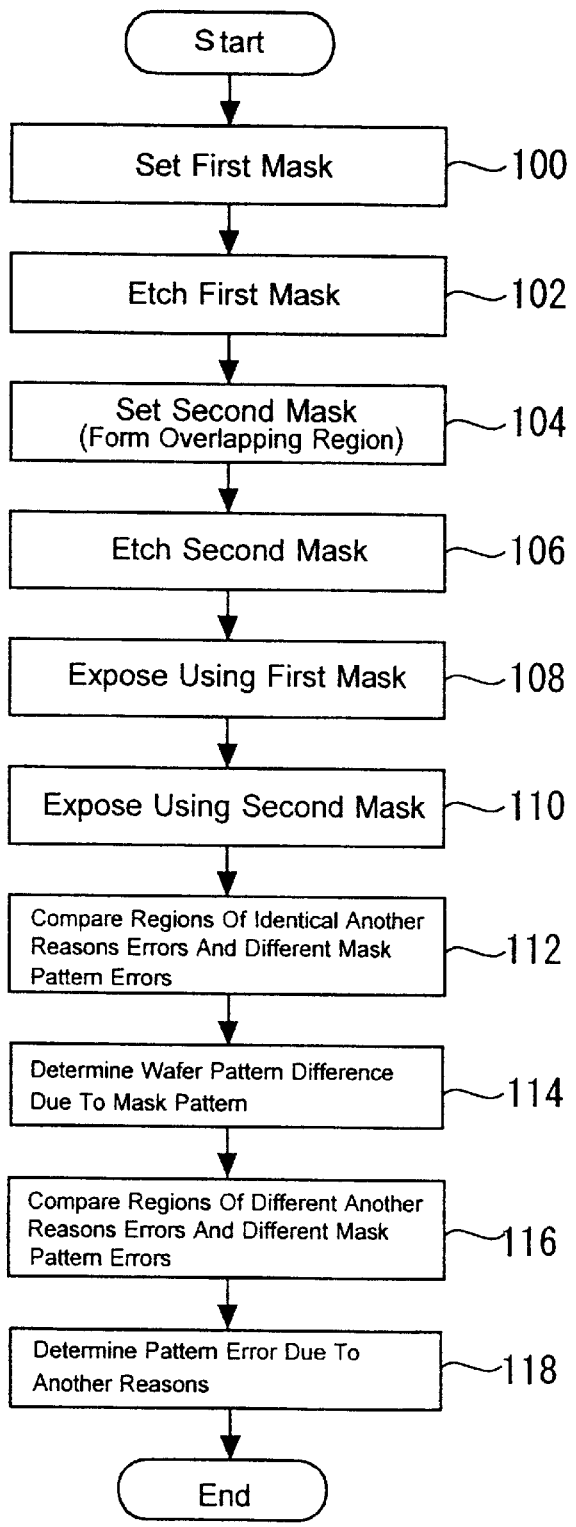
FIG. 1 is a flowchart for describing the flow of a method of analyzing a factor responsible for error in wafer pattern according to a first embodiment of the present invention.

In the following, principles and embodiments of the present invention will be described with reference to the accompanying drawings. The members and steps that are common to some of the drawings are given the same reference numerals and redundant descriptions therefor may be omitted.

Embodiment 1

FIG. 1 is a flowchart for describing the flow of a factor analyzing method according to a first embodiment of the present invention. As shown in FIG. 1, processing pertaining to step 100 is first performed.

In step 100, a first mask is placed in an apparatus for manufacturing a photolithographic mask.

Figure 2:
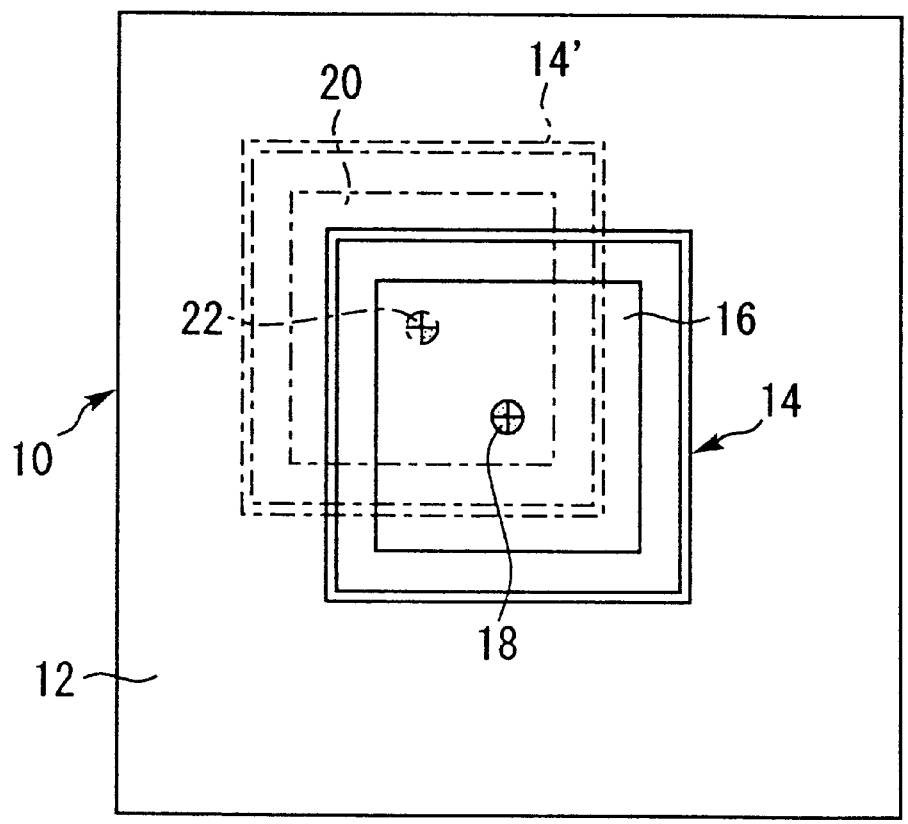
FIG. 2 is a plan view showing an etching chamber of an apparatus to be employed in the first embodiment.

FIG. 2 is a plan view showing an etching chamber 12 of an apparatus 10 to be employed in step 100. The apparatus 10 etches a mask in order to form a desired mask pattern on the mask. As shown in FIG. 2, a mask table 14 on which a mask is to be placed is disposed in the etching chamber 12. A recessed portion corresponding to the size of a mask is formed in the mask table 14, and a mask is set on the mask table 14 while fitting into the recessed portion.

The geometry designated by a solid line shown in FIG. 2 denotes the mask table 14 located at the center of the etching chamber 12 as well as a first mask 16 placed on the mask table 14. A center mark 18 denotes the center of the first mask 16. The geometry designated by a chain line shown in FIG. 2 denotes a mask table 14' which has been moved to a predetermined location as well as a second mask 20 placed on the mask table 14'. A center mark 22 denotes the center of the second mask 20. As mentioned above, the apparatus 10 enables the travel of the mask table 14 within the etching chamber 12.

In FIG. 2, the mask table 14' is located so that there is formed an overlap region of the first mask 16 and the second mask 20. More specifically, the mask table 14' is located such that the center 18 of the first mask 16 overlaps the corner of the second mask 20; in other words, the center 22 of the second mask 20 overlaps the corner of the first mask 16. The location of the mask table 14 shown in FIG. 2 will be hereinafter referred to as a "first position," and the location of the mask table 14' shown in FIG. 2 will be hereinafter referred to as a "second position." In step 100, the first mask 16 is placed on the mask table 14 located in the first position.

In step 102, the first mask 16 is etched on the mask table 14 set in the first position. After completion of the etching process, the first mask 16 is taken out of the mask table 14.

In step 104, the second mask 20 is placed on the mask table 14' that has been moved to the second position.

In step 106, the second mask 20 placed on the mask table 14' is etched. After completion of the etching process, the second mask 20 is taken out of the mask table 14'.

Conditions for determining an etching rate, for example, the distribution of etching gas, are not necessarily consistent across the inside of the etching chamber 12. For this reason, even if the masks 16 and 20 are etched with the same setting conditions, errors ascribable to a variation in the etching conditions arise in the mask pattern formed on the first mask 16, as well as in the mask pattern formed on the second mask 20.

Figure 3A:
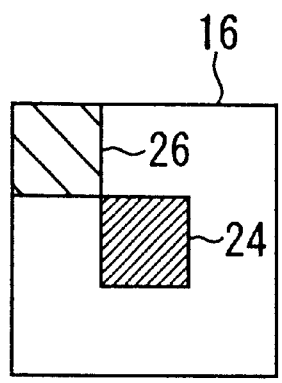
FIG. 3A is a plan view showing a distribution of mask patterns provided in a first mask used in the first embodiment.
Figure 3B:
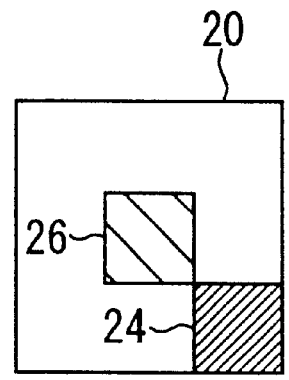
FIG. 3B is a plan view showing a distribution of mask patterns provided in a second mask used in the first embodiment.

FIG. 3A is a conceptual illustration for describing the relationship between the first mask 16 and the etching conditions, and FIG. 3B is a conceptual illustration for describing the relationship between the second mask 20 and the etching conditions. In these illustrations, a region 24 is etched at substantially the center of the etching chamber 12, and a region 26 is etched in a position that offsets toward an upper left direction from the center of the etching chamber 12 shown in FIG. 2.

The conditions that determine an etching rate are determined in accordance with the location of the mask within the etching chamber 12. Accordingly, in the first embodiment, the region 24 located at the center of the first mask 16 and the region 26 located in the lower right corner of the second mask 20 shown in FIG. 3B are etched in the same distribution of etching gas. Thus, there are formed mask patterns in the respective regions 24 with substantially the same degree of accuracy. Similarly, the region 26 located in the upper right corner of the first mask 16 shown in FIG. 3A and the region 26 located at the center of the second mask 20 are etched in the same distribution of etching gas. Accordingly, in the respective regions 26 are formed mask patterns with substantially the same degree of accuracy.

In step 108, a semiconductor wafer is exposed through use of the first mask 16, and the thus-exposed resist film formed on the semiconductor wafer is developed.

Figure 4:
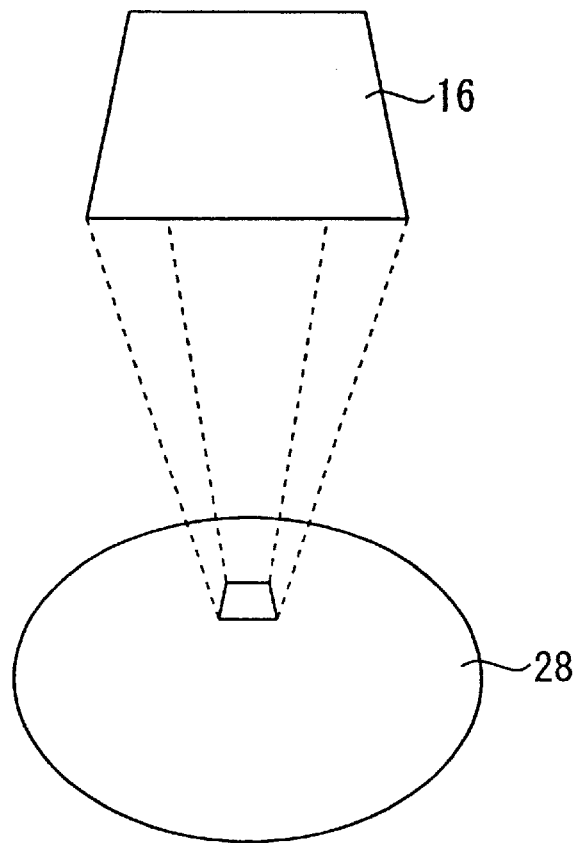
FIG. 4 is a conceptual illustration for describing a procedure for transferring the mask patterns provided in the first mask.

FIG. 4 is a conceptual illustration showing a state in which a semiconductor wafer 28 is exposed to light that has passed through the first mask 16. The semiconductor wafer 28 is exposed through use of a known apparatus called a stepper. The stepper transfers a mask pattern onto a semiconductor wafer while scaling down the mask pattern on a scale of, for example, 5:1. During a process in which the stepper transfers a mask pattern, an error ascribable to an aberration of the stepper or a like factor (hereinafter referred to as an "aberration error") arises in a wafer pattern. Further, in a process in which a wafer pattern is formed by means of developing a resist film, an error ascribable to a variation in the thickness of a resist film or a like factor (hereinafter referred to as a "resist error") arises in the wafer pattern.

The size of an aberration error is substantially univocally determined according to a path along which exposing radiation travels. Thus, an aberration error arising in a wafer pattern included in a region on which a mask pattern is transferred by a single shot of exposing radiation (hereinafter referred to as a "single shot region") always assumes a substantially constant distribution. The thickness of a resist film is almost determined by the position thereof on the semiconductor wafer. Accordingly, the size of an error arising in a wafer pattern for reasons of an aberration or a variation in the thickness of a resist film (i.e., an error ascribable to another reason) is determined substantially in accordance with the position of the wafer pattern within a single shot region and the location of the single shot region on the semiconductor wafer.

The above-described relationship between the errors and their causes will be described in more detail by reference to FIGS. 5A and 5B.

Figures 5A, 5B:
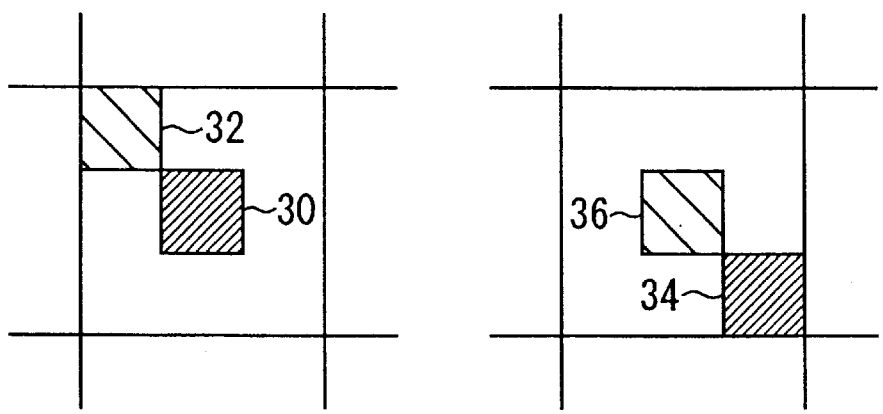
FIG. 5A shows a single shot region transferred in a predetermined position on the semiconductor wafer through use of the first mask.
FIG. 5B shows a single shot region transferred in a predetermined position on the semiconductor wafer through use of the second mask.

FIG. 5A shows a single shot region transferred in a predetermined position on the semiconductor wafer through use of the first mask 16. FIG. 5B shows a single shot region transferred in the same position where the single shot shown in FIG. 5A is transferred, through use of the second mask 20.

In FIG. 5A, a region 30 corresponds to the region 24 of the first mask 16. The accuracy of a wafer pattern formed in the region 30 reflects the accuracy of the mask pattern formed in the region 24. In FIG. 5A, a region 32 corresponds to the region 26 of the first mask 16. Accordingly, the accuracy of a wafer pattern formed in the region 32 reflects the accuracy of the mask pattern formed in the region 26. The region 30 is hereinafter referred to as a "first region 30," and the region 32 is hereinafter referred to as a "second region 32."

In FIG. 5B, a region 34 corresponds to the region 24 of the second mask 20. The accuracy of a wafer pattern formed in the region 34 reflects the accuracy of the mask pattern formed in the region 24. In FIG. 5B, a region 36 corresponds to the region 26 of the second mask 20. Accordingly, the accuracy of a wafer pattern formed in the region 36 reflects the accuracy of the mask pattern formed in the region 26. The region 34 is hereinafter referred to as a "third region 34," and the region 36 is hereinafter referred to as a "fourth region 36."

As mentioned above, the size of an error ascribable to another reason arising in a wafer pattern is determined in accordance with the location of the wafer pattern within the single shot region and the location of the single shot region within the semiconductor wafer. Accordingly, there arises errors ascribable to another reason to substantially the same extent both in the wafer pattern formed in the first region 30 shown in FIG. 5A and the wafer pattern formed in the fourth region 36 shown in FIG. 5B.

In step 112, sizes of wafer patterns are compared targeting two regions, such as the first region 30 and the fourth region 36, in which errors ascribable to mask patterns arise differently and errors ascribable to another reasons arise identically. It is noted that, in the present step, wafer patterns having the same design values are compared with each other.

A dimensional difference determined by the comparison can be considered to correspond to a dimensional difference ΔLM between the wafer patterns ascribable to a mask pattern error, more specifically, a dimensional difference of wafer patterns due to a difference between the mask patterns formed in the regions 24 and 26.

In step 114, there is determined a dimensional difference between the two wafer patterns that have been compared with each other in step 112. The thus-determined dimensional difference is detected as a dimensional difference ΔLM ascribable to a difference between the mask patterns. For example, in a case where a dimensional difference of 20 nm is acknowledged as a result of the comparison performed in step 112, a dimensional difference ΔLM is detected as corresponding to a value of 20 nm.

The positions of the first and second regions 30 and 32 shown in FIG. 5A differ from each other within the single shot region. Thus, in those regions 30 and 32 are produced errors having different sizes due to reasons other than the mask pattern error. Further, in the wafer patterns formed in the regions 30 32 also arises the dimensional difference ΔLM ascribable to the difference between the mask patterns in the regions 24 and 26. Consequently, a dimensional difference ΔL0+ΔLM, which is the sum of a difference ΔL0 ascribable to another reason and the dimensional difference ΔLM ascribable to a mask pattern error, is thought to arise in the wafer patterns formed in the first region 30 and the second region 32.

In step 116, sizes of wafer patterns are compared targeting two regions, such as the first region 30 and the second region 32 discussed above, in which errors ascribable to mask patterns arise differently and errors ascribable to another reasons arise also differently. It is noted that, in the present step, wafer patterns having the same design values are compared with each other.

In step 118, there is determined a dimensional difference between the two wafer patterns that have been compared with each other in step 116, and the thus-determined dimensional difference is detected as ΔL0+ΔLM. For example, in a case where a dimensional difference of 50 nm is acknowledged as a result of the comparison performed in step 116, a dimensional difference ΔL0+ΔLM is detected as assuming avalue of 50 nm . The dimensional difference ΔL0 ascribable to another reason can be determined by subtraction of the dimensional difference ΔLM determined in step 114 from ΔL0+ΔLM. For example, in a case where the dimensional difference ΔLM assumes a value of 20 nm, there is detected adimensional difference ΔL0 of 30 nm . After completion of the processing operations, the current processing cycle is completed.

As mentioned above, the factor analysis method of the first embodiment enables detection of an error arising in a wafer pattern for reasons of a mask pattern error and another error ascribable to a factor other than the mask pattern error, for example, a stepper's aberration, while distinguishing between the errors. Therefore, use of the factor analysis method of the first embodiment enables accurate determination of a problem for ensuring a desired accuracy of a pattern, thereby effectively promoting development of a semiconductor device.

In the previous embodiment, the dimensional difference ΔLM ascribable to a mask pattern error is determined by means of comparison between the first region 30 and fourth region 36, the first region 30 being included in the single shot region (see FIG. 5A) formed through use of the first mask 16 and the fourth region being included in the single shot region (see FIG. 5B) formed through use of the second mask 20. The present invention is not limited to such a configuration. A modification of the embodiment will now be described by reference to FIGS. 6A and 6B.

Figure 6A:
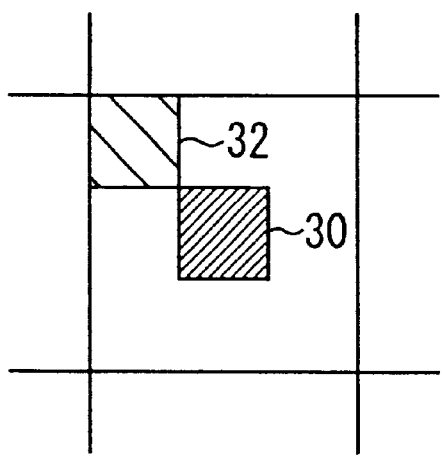
FIG. 6A shows another single shot region transferred in a predetermined position on the semiconductor wafer through use of the first mask.
Figure 6B:
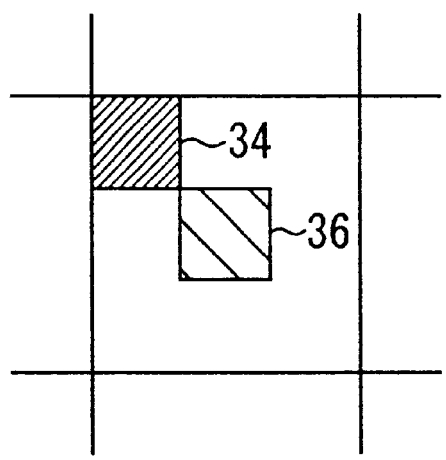
FIG. 6B shows another single shot region transferred in a predetermined position on the semiconductor wafer through use of the second mask.

FIG. 6A is a conceptual illustration showing a wafer pattern, which is transferred to a predetermined location on a semiconductor wafer by a single shot of exposing radiation through use of the first mask 16. FIG. 6B is a conceptual illustration showing a wafer pattern, which is transferred to the same location where the wafer pattern shown in FIG. 6A is transferred, by a single shot of exposing radiation while the second mask 20 is attached to the stepper after having been rotated through 180°.

In a case where the second mask 20 is attached to the stepper after having been rotated through 180°, the fourth region 36 (see FIG. 6B) is formed in the position where the first region 30 (see FIG. 6A) is to be formed. Further, the third region 34 (see FIG. 6B) is formed in the position where the second region 32 (see FIG. 6A) is to be formed. In this case, the dimensional difference ΔLM may be determined by comparison between the first region 30 and the fourth region 36 or by comparison between the second region 32 and the third region 34.

Although in the embodiment the first and second masks 16 and 20 are etched while the center thereof are located in an overlap region between the first and second masks 16 and 20 (see FIG. 2), the present invention is not limited to such a configuration. In a case where one of the two masks is attached to the stepper after having been rotated through 180°, the factor analysis method of the present embodiment enables detection of errors unless the centers of the two masks are located in an overlap region between the two masks.

In the first embodiment described above, the mask table 14 of the apparatus 10 is made movable in order to facilitate formation of the first and second masks 16 and 20. However, the present invention is not limited to such an embodiment. The mask table 14 of the apparatus 10 may be of stationary type, so long as the mask table enables fixing of masks respectively to the location of the first mask 16 and the location of the second mask 20, which are shown in FIG. 2.

The major benefits of the present invention described above are summarized as follows:

The present invention enables formation of a wafer pattern corresponding to a single shot region by exposure use of a first mask, as well as formation of another wafer pattern corresponding to a single shot region by exposure through use of a second mask. These two single shot regions include areas which are located in the same position within a single shot region and correspond to mask patterns having different degrees of accuracy. The wafer patterns located in the respective areas are compared in size with each other, thereby determining a dimensional difference between the wafer patterns ascribable to a difference in the mask patterns. Further, the two single shot regions include areas which differ in position from each other within the single shot region and correspond to mask patterns having different degrees of accuracy. A total amount of a dimensional difference ascribable to a mask pattern error and a dimensional difference ascribable to another reason is determined by comparison between the sizes of the wafer patterns located in the respective areas. A dimensional difference ascribable to another reason can be detected by subtraction, from the total amount of dimensional difference, of the dimensional difference ascribable to the difference between the mask patterns.

According to the second aspect of the present invention, both a first region and a fourth region are located in the center of the respective single shot regions. An error ascribable to another reason arises, to the same extent, in the wafer pattern formed in the first region, as well as in the wafer pattern formed in the fourth region. Accordingly, a dimensional difference ascribable to a difference between mask patterns can be accurately detected by comparison between the size of the wafer pattern included in the first region and the size of the wafer pattern included in the fourth region. A total amount of dimensional difference which is the sum of a dimensional difference ascribable to a difference between mask patterns and a dimensional difference ascribable to another reason arises between the wafer pattern included in the first region and the wafer pattern included in the second region. The dimensional difference ascribable to another reason can be accurately determined by subtraction, from the total amount of dimensional difference, of the dimensional difference ascribable to a difference between mask patterns.

According to the third aspect of the present invention, the second region and the third region within the single shot region can be matched in position by appropriately setting the angle atwhichthesecondmask is attachedtothe apparatus. Thus, as the case of the second aspect of the present invention, the dimensional difference ascribable to a difference between mask patterns and a dimensional difference ascribable to another reason can be determined accurately.

According to the fourth aspect of the present invention, comparison between wafer patterns is made immediately after development of a resist film. In this case, a cause for inducing an error in a wafer pattern can be specified to only any one of an error in a mask pattern, an error associated with transfer of a pattern, and an error associated with development of a resist film. Therefore, the present invention enables accurate analysis of the cause of an error in a wafer pattern.

According to the fifth aspect of the present invention, etching of a mask in the first position and etching of a mask in the second position can be readily performed.

According to the sixth aspect of the present invention, since a mask table can be traveled between the first position and the second position, two masks can be very readily produced.

According to the seventh aspect of the present invention, two masks can be produced such that the centers of the masks are located in an overlap between the two masks.

Further, the present invention is not limited to these embodiments, but variations and modifications may be made without departing from the scope of the present invention.

The entire disclosure of Japanese Patent Application No. Hei 11-347336 filed on Dec. 7, 1999 including specification, claims, drawings and summary are incorporated herein by reference in its entirety.

What is claimed is:

1. A method of analyzing factor responsible for errors in a wafer pattern formed on a semiconductor wafer, the method comprising the steps of:

placing a first mask in a first position within an etching chamber;

forming a mask pattern by etching the first mask;

placing a second mask in a second position within the etching chamber such that an overlap region exists between a portion of the first mask and a portion of the second mask, provided that the first mask is set in the first position;

forming a mask pattern by etching the second mask;

forming a wafer pattern corresponding to a single shot region on the semiconductor wafer by exposing the semiconductor wafer through use of the first mask;

forming a wafer pattern corresponding to a single shot region on the semiconductor wafer by exposing the semiconductor wafer through use of the second mask; and detecting a dimensional difference ascribable to a difference between mask patterns and a dimensional difference ascribable to another reason while distinguishing the dimensional differences from each other, by comparison between the size of the wafer pattern which is included in an area (first overlap region) within the single shot region formed through use of the first mask and which corresponds to the overlap region and the size of the wafer pattern which is included in an area (second overlap region) within the single shot region formed through the second mask and which corresponds to the overlap region.

2. The method according to claim 1, wherein the first overlap region includes a first region which is located in the center of the single shot region formed through use of the first mask and a second region which is located in the corner of the single shot region;

the second overlap region includes a third region which is located in the corner of the single shot region formed through use of the second mask and a fourth region which is located in the center of the single shot region;

the step of detecting dimensional differences while distinguishing them from each other further comprising the steps of:

detecting a difference between the size of the wafer pattern included in the first region and the size of the wafer pattern included in the fourth region, as a dimensional difference ascribable to the difference between the mask patterns; and detecting the dimensional difference ascribable to another reason by subtraction of the dimensional difference ascribable to the difference between the mask patterns from the difference between the size of the wafer pattern included in the first region and the size of the wafer pattern included in the second region.

3. The method according to claim 1, wherein the step of forming a wafer pattern as a single shot region through use of the second mask further comprises a step of determining an angle at which the second mask is attached such that a portion corresponding to the first overlap region in the single shot region and a portion corresponding to the second overlap region in the single shot region are matched in position;

the first overlap region includes a first region which is located in the center of the single shot region formed through use of the first mask and a second region which is located in the corner of the single shot region;

the second overlap region includes a third region which is located in the corner of the single shot region formed through use of the second mask and a fourth region which is located in the center of the single shot region; and the step of detecting dimensional difference while distinguishing them from each other further comprising the steps of:

detecting a difference between the size of the wafer pattern included in the second region and the size of the wafer pattern included in the third region, as a dimensional difference ascribable to the difference between the mask patterns; and detecting the dimensional difference ascribable to another reason by subtraction of the dimensional difference ascribable to the difference between the mask patterns from the difference between the size of the wafer pattern included in the first region and the size of the wafer pattern included in the second region.

4. The method according to claim 1, wherein the wafer patterns are compared in size with each other immediately after development of an exposed resist of the semiconductor wafer.

5. The method according to claim 2, wherein the wafer patterns are compared in size with each other immediately after development of an exposed resist of the semiconductor wafer.

6. The method according to claim 3, wherein the wafer patterns are compared in size with each other immediately after development of an exposed resist of the semiconductor wafer.

7. An apparatus for producing a mask pattern by etching a photolithographic mask, comprising:

an etching chamber for etching a mask pattern; and a mask table which retains a mask within the etching chamber and can hold the mask at a first position and a second position such that an overlap region exists between a portion of the mask set in the first position and a portion of the mask set in the second position, provided that the masks are set in the first position and the second position simultaneously.

8. The apparatus according to claim 7, wherein the mask table can be traveled between the first position and the second position.

9. The apparatus according to claim 7, wherein the first and second positions are set such that a center area of the mask set in the first position and a center area of the mask set in the second position are included in the overlap region.

10. The apparatus according to claim 8, wherein the first and second positions are set such that a center area of the mask set in the first position and a center area of the mask set in the second position are included in the overlap region.

11. An apparatus for producing a mask pattern by etching a photolithographic mask, comprising:

an etching chamber for etching a photolithograhic mask pattern;

a mask table comprising a recessed area in which a mask is to be disposed, said mask table configured to adopt a first position and a second position within the etching chamber, wherein the first position of the mask table corresponds to a first location of the mask in the etching chamber and wherein the second position of the mask table corresponds to a second location of the mask in the etching chamber, and wherein a portion of the mask in the first location overlaps, in an overlapping region, a portion of the mask in the second location.

12. The apparatus according to claim 11, wherein the apparatus further comprises a driving means to move the mask table between said first position and said second position.

13. The apparatus according to claim 11, wherein said first position and said second positions are selected such that a center area of the mask at the first location and a center area of the mask at the second location are both included in the overlapping region.

14. The apparatus according to claim 11, wherein said etching chamber further comprises at least one of an etchant production means to generate an etchant from at least one input gas and an etchant delivery means, wherein said etchant production means and said etchant delivery means are configured to output an etchant within the etching chamber.

15. The apparatus according to claim 14, wherein said first position and said second positions are selected such that a center area of the mask at the first location and a center area of the mask at the second location are both included in the overlapping region.

16. The apparatus according to claim 11, further comprising:

a substrate having a resist provided thereon disposed within the etching chamber; and an exposing source configured to irradiate said resist through said mask and transfer a mask pattern to said resist.

* * * * *